US008422284B2

(12) United States Patent
Folks et al.

(10) Patent No.: US 8,422,284 B2
(45) Date of Patent: Apr. 16, 2013

(54) HIGH DENSITY SPIN TORQUE THREE DIMENSIONAL (3D) MEMORY ARRAYS ADDRESSED WITH MICROWAVE CURRENT

(75) Inventors: Liesl Folks, Campbell, CA (US); Bruce David Terris, Sunnyvale, CA (US)

(73) Assignee: HGST Netherlands B.V., Amsterdam (NL)

( * ) Notice: Subject to any disclaimer, the term of this patent is extended or adjusted under 35 U.S.C. 154(b) by 684 days.

(21) Appl. No.: 12/633,750

(22) Filed: Dec. 8, 2009

(65) Prior Publication Data

US 2010/0118585 A1   May 13, 2010

Related U.S. Application Data

(62) Division of application No. 11/642,277, filed on Dec. 19, 2006, now Pat. No. 7,652,915.

(51) Int. Cl.
*G11C 11/14* (2006.01)

(52) U.S. Cl. ........ 365/171; 365/148; 365/153; 365/173; 977/933; 977/935

(58) Field of Classification Search .................... 365/48, 365/55, 62, 66, 74, 78, 80–93, 100, 130, 365/131, 148, 158, 171–173, 209, 213, 225.5, 365/230.07, 232, 243.5; 257/421, E21.665; 438/810–816, 817–825.1, 826; 428/3; 977/933–935
See application file for complete search history.

(56) References Cited

U.S. PATENT DOCUMENTS

| | | | |
|---|---|---|---|
| 5,511,026 A * | 4/1996 | Cleveland et al. ....... | 365/189.09 |
| 5,695,864 A | 12/1997 | Slonczewski | |
| 6,097,625 A * | 8/2000 | Scheuerlein ................. | 365/171 |
| 6,172,902 B1 | 1/2001 | Wegrowe | |
| 6,178,112 B1 | 1/2001 | Bessho | |
| 6,351,409 B1 | 2/2002 | Rizzo | |
| 6,522,577 B1 | 2/2003 | Earl | |
| 6,567,299 B2 * | 5/2003 | Kunikiyo et al. ............. | 365/173 |
| 6,771,534 B2 | 8/2004 | Stipe | |
| 6,791,868 B2 | 9/2004 | Gider | |
| 6,807,087 B2 | 10/2004 | Deak | |
| 6,888,750 B2 * | 5/2005 | Walker et al. ............ | 365/185.05 |
| 6,925,002 B2 | 8/2005 | Schwarzl | |
| 7,274,247 B2 * | 9/2007 | Ward et al. .................... | 327/534 |
| 2004/0061981 A1 | 4/2004 | Covington | |
| 2005/0106810 A1 | 5/2005 | Pakala | |

OTHER PUBLICATIONS

Gen Tatara, Eiji Saitoh, Masahiko Ichimura, and Hiroshi Kohno, Domain wall displacement triggered by an AC current below threshold, Nov. 11, 2004, 3 pages.

Xin Liu, Xiong-Jun Liu, and Zheng-Xin Liu, Classical and quantum depinning of a domain wall with a fast varying spin-polarized current, Nov. 7, 2005, 8 pages.

G.D. Fuchs, I.N. Krivorotov, P.M. Braganca, N.C. Emley, A.G.F. Garcia, D.C. Ralph, and R.A. Buhrman, Adjustable spin torque in magnetic tunnel junctions with two fixed layers, Applied Physics Letters 86, 152509, Apr. 6, 2005, 3 pages, American Institute of Physics.

A.D. Kent, B. Ozyilmaz, and E. Del Barco, Spin-transfer-induced precessional magnetization reversal,—Applied Physics Letters, May 10, 2004, 3 pages, vol. 84, No. 19, American Institute of Physics.

H.W. Schumacher, C. Chappert, R.C. Sousa and P.P. Freitas, Effective bit addressing times for precessional switching of magnetic memory cells, Journal of Applied Physics 97 123907, Jun. 20, 2005, 7 pages, American Institute of Physics.

Bret Heinrich, Yaroslav Tserkovnyak, Georg Woltersdorf, Arne Brataas, Radovan Urban, and Gerrit E.W. Bauer, Dynamic Exchange Coupling in Magnetic Bilayers, Physical Review Letters, May 9, 2003, 4 pages, vol. 90, No. 18, The American Physical Society.

\* cited by examiner

*Primary Examiner* — Harry W Byrne
(74) *Attorney, Agent, or Firm* — Maryam Imam; IPxLAW Group LLP

(57) ABSTRACT

One embodiment of the present invention includes a three dimensional memory array having a plurality of memory elements coupled to form the array through a single top lead and a single bottom lead, each memory element including a magnetic free layer in which non-volatile data can be stored, wherein each memory element possesses unique resonant frequencies associated with each digital memory state, thereby enabling frequency addressing during parallel write and read operations, each memory element further including a fixed layer and a spacer formed between the free layer and the fixed layer.

8 Claims, 14 Drawing Sheets

Write operation ac wavetrain

Bias T output

FIG. 7(a)

Read operation

Output wavetrain $v_1$ ... $v_n$

FIG. 7(b)

HIGH DENSITY SPIN TORQUE THREE DIMENSIONAL (3D) MEMORY ARRAYS ADDRESSED WITH MICROWAVE CURRENT

CROSS REFERENCE TO RELATED APPLICATIONS

This application is a divisional application of and claims priority to U.S. patent application Ser. No. 11/642,277, filed on Dec. 19, 2006 by Liesl Folks et al. and entitled "High Density Spin Torque Three Dimensional (3D) Memory Arrays Addressed With Microwave Current".

BACKGROUND OF THE INVENTION

1. Field of the Invention

The present invention relates generally to the field of high density multi-dimensional nonvolatile memory arrays and particularly to multi-dimensional memory arrays made of frequency-addressable spin transfer torque (STT) memory elements, each including at least one free layer, wherein each memory element has a different resonant frequency, due to the shape and material of the memory element, thereby creating large nonvolatile memory arrays.

2. Description of the Prior Art

High density nonvolatile memory devices, based on flash technology, have become increasingly popular for use in many and diverse applications, computing being one of them.

However, such technology is approaching practical limits for higher areal densities due to lithographic constraints. The critical lithographic dimension F is currently around 45 nanometers (nm) for flash technology, and is projected to decrease by around 20% per annum in the near future, although reducing the size of F beyond factor of approximately two will be very difficult. The corresponding bit size is approaching 4 $F^2$ for single-bit-per-cell flash memory, and 2 $F^2$ for double-bit-per-cell flash memory. While multiple bits may in principle be stored in a single cell, which increases areal density, this has proved impractical beyond 2 bits/cell because signal-to-noise ratios are reduced due the presence of multiple, closely spaced, levels in one memory cell.

Alternative storage devices, comprising single-bit-per-cell multi-layer arrangements of storage elements, have been demonstrated, for example by Matrix Semiconductor, Inc. of Santa Clara, Calif. To date, such multi-layer storage devices have allowed only write-once or one-time-write operation, and have not allowed multiple write operations to memory. New materials for re-writable memory are a topic of current research and require new inventions to be integrated into multilayer devices with large storage capacities.

One class of solid state memory devices, or nonvolatile memory, is Magnetic Random Access Memory (MRAM). MRAM devices are based on magnetic materials. MRAM devices comprise cells or elements having a magnetically hard layer (the "pinned" or "fixed" layer) and a magnetically soft layer (the "free" layer). Writing to MRAM is performed by passing current through current leads that are formed on either side of each memory element in order to create a local induced magnetic field which sets the direction of the soft layer magnetization. Significant problems have been encountered however in scaling these devices to high densities. In particular, disturbances to neighboring cells or elements can occur during writing, sometimes causing a neighboring cell to be erroneously written.

Spin Transfer Torque (STT) devices are similar to MRAM devices except that the current paths pass through the magnetic layers of each memory element, rather than to the side of each memory element, and the soft layer of the memory element is set via the transfer of spin torque from the spin polarized current passing through that layer. However, this approach requires rather high current densities, which are undesirable due to heat and power consumption concerns. In addition, this approach is difficult to scale to high areal densities using a multilevel architecture approach, as this would require cells with multiple free layers and it would be generally difficult to switch each layer independently with only a spin polarized direct current.

In light of the foregoing, there is a need for a high density three-dimensional nonvolatile memory array, which incorporates multiple layers of memory elements, where each memory element can be switched independently.

SUMMARY OF THE INVENTION

Briefly, in one embodiment of the present invention, a two-dimensional (2-D) nonvolatile memory array is disclosed to include a plurality of nonvolatile memory elements coupled to form the array, through a single top lead and a single bottom lead, each memory element including a fixed layer and a free layer, separated by a spacer, wherein the direction of magnetization of the free layer relative to the fixed layer determines the state of the memory element, and wherein each memory element may be frequency addressed for reading and writing based on a unique resonant frequency.

In another embodiment of the present invention, a three-dimensional (3-D) nonvolatile memory array is disclosed to include a plurality of nonvolatile memory elements, arranged in stacks, each stack having a different shape anisotropy than the other stacks, the plurality of memory elements further arranged in layers with each layer having a free layer material with different magnetocrystalline anisotropy (MCA) than the other layers, such that each memory element is selectable based on a unique free layer resonant frequency.

The foregoing and other objects, features and advantages of the invention will become apparent after reading the following detailed description of the preferred embodiments, which is illustrated in the several figures of the drawing.

BRIEF DESCRIPTION OF THE DRAWINGS

FIG. 7(a) shows the timing diagram of some of the signals generated and used during the write operation of FIG. 6(a).

FIG. 7(b) shows the timing diagram of some of the signals generated and used during the read operation of FIG. 6(b).

DETAILED DESCRIPTION OF THE PREFERRED EMBODIMENT

Figure 1A:
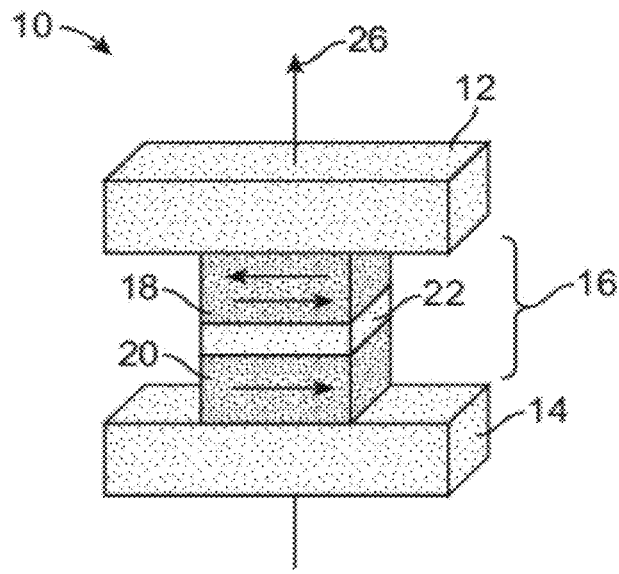
FIG. 1(a) shows a CPP device 10 including a top lead 12 and a bottom lead 14 for connecting therethrough to the device 10 and being a part of a pillar (or nonvolatile memory element) 16 made of a free layer 18 that is separated from a fixed layer 20 by a spacer 22, in accordance with an embodiment of the present invention.

In the embodiments of the present invention, shown and/or discussed herein, a memory structure is achieved that is designed with a simple materials set and delivers improved bit packing densities and therefore higher capacities for a given form factor. In one embodiment, a three dimensional (3-D) memory arrangement (structure or array) is presented comprising multiple memory (or storage) elements removing the need for individual write and read lines to be attached to each memory element of the array, accordingly, offering economies in manufacturing and in device size. A "device" as used herein includes one or more memory elements.

A high density nonvolatile memory structure is disclosed having multiple layers of non-volatile memory elements, each layer having been created with a different intrinsic magnetocrystalline anisotropy, the layers of memory elements being patterned into stacks of memory elements, each of the stacks possessing a different aspect ratio and thus a different shape anisotropy allowing for large arrays of memory elements, each with a unique resonant frequency and thus no need for individual wires to each layer or memory element.

By way of background, each memory element, depending on its total anisotropy, for example, determined by MCA and shape anisotropy, among other factors, has a characteristic frequency at which it will oscillate, if disturbed with suitable spin polarized current, and this frequency is referred to as the resonant frequency. Each magnetization state of each memory element has a separate resonant frequency. If an alternating current at the resonant frequency is applied to the memory element, an advantageously lower direct current, perhaps zero, is required in conjunction to write the memory element or to change the direction of its magnetization. Thus, the required critical current is lower than that currently used by prior art nonvolatile memory. In an array of memory elements, if a resonant frequency is applied to the entire array, as in the embodiments of the present invention, only the memory element with a matching resonant frequency would be excited (or selected). The application of current to the entire array would only require two current leads thereby eliminating the need for unique pairs of wires to each memory cell, which as earlier noted is one of the limitations experienced by prior art nonvolatile memory.

Thus, in the embodiments of the present invention, high speed current-induced ("spin-torque") switching of individual nanomagnetic elements is effectuated and electrical measurements of the associated microwave oscillations are made. The microwave oscillation frequency is a function of the memory element size, shape, anisotropy, damping and the like. Accordingly, the resonant or oscillation frequency ($f_0$) is selected by appropriate materials engineering and lithographic processing. These frequencies are measured following the application of a DC current to the memory element, as will become apparent. Therefore, a combination of microwave field or current at the device resonant frequency and a small DC bias field or current is used. The memory element is read either by measuring resistance with a DC current or by measuring the resonant frequency, such as described in publications entitled "Microwave Oscillations Of A Nanomagnet Driven By A Spin-Polarized Current," S. I. Kiselev et al., Nature 425 (2003) 380-383, and "Time-Domain Measurements Of Nanomagnet Dynamics Driven By Spin-Transfer Torques," I. N. Krivorotov et al., Science 307 (2005) 228-231.

Thus, high bit packing density using layered memory elements, each of which possess different microwave oscillation frequencies because each has been designed with a different magnetic anisotropy, is achieved. Moreover, in one embodiment of the present invention, these layers of memory elements are patterned into stacks of memory elements each of which possesses a different aspect ratio and thus a different shape anisotropy allowing for large arrays of memory elements, each with unique resonant frequencies. In this manner, large arrays of memory elements, each with unique resonant frequencies, are fabricated. As an example, in the simplest case, the antiparallel, which may be a logical "0", state and the parallel, which may be a logical "1", state each have a different resonant frequency, thus there would be two resonant frequencies for each element.

Referring now to FIG. 1(a), a current-perpendicular-to-plane (CPP) device 10 is shown to include a top lead 12 and a bottom lead 14 used for establishing connection with the device 10 which further includes a pillar (or nonvolatile memory element) 16, in accordance with an embodiment of the present invention. In one embodiment, the memory element 16, which is a nonvolatile memory element, is made of a magnetic free layer 18 that is separated from a magnetic fixed layer 20 by a non-magnetic spacer 22. In one embodiment, the memory element 16 is a spin transfer torque (STT) memory element. In FIG. 1(a), the free layer 18 and the fixed layer 20 have in-plane anisotropy, i.e. parallel to the plane, as shown by the direction of the bold-set arrows.

In FIG. 1(a), examples of material used as the free layer 18 are 22 Å of $Co_{50}Fe_{50}$ or the bilayer structure 6 Å $Co_{50}Fe_{50}$/35 Å $Ni_{80}Fe_{20}$. An example of the materials used to form a fixed layer 20 which minimizes demagnetizing field effects is made of the following thickness and material composite: 25 Å $Co_{50}Fe_{50}$/8 Å Ru/25 Å $Co_{50}Fe_{50}$. An example of material used as the spacer 22 is of the thickness and material 40 Å Cu.

In another embodiment of the present invention, the free and fixed layers could have perpendicular anisotropy and in yet another embodiment, their anisotropy axes could be at some angle to each other, both of which embodiments are discussed and shown in subsequent figures and discussions below.

In FIG. 1(a), the direction of current, represented by the arrow 26, is perpendicular to the film plane. The shape of the device 10 is generally lithographically defined. Examples of current lithography techniques are photolithography, deep ultra-violet, electron beam, and others. The leads 12 and 14 are used for applying current thereto to invoke the storage (programming of or writing to) or read-back of data (or bit of information) stored in the memory element 16. In one embodiment, the easy anisotropy axis is perpendicular to the film plane as this leads to a smaller required critical write current. High bit packing density (and thus high device capacity) is achieved through layering memory elements, such as the memory element 16, each of which possesses different resonant microwave oscillation frequencies because each layer has been designed with a different total magnetic anisotropy.

The pillar 16 is interchangeably referred to as a "spin transfer torque (STT) memory element" 16 capable of storing information in binary format.

Figure 1B:
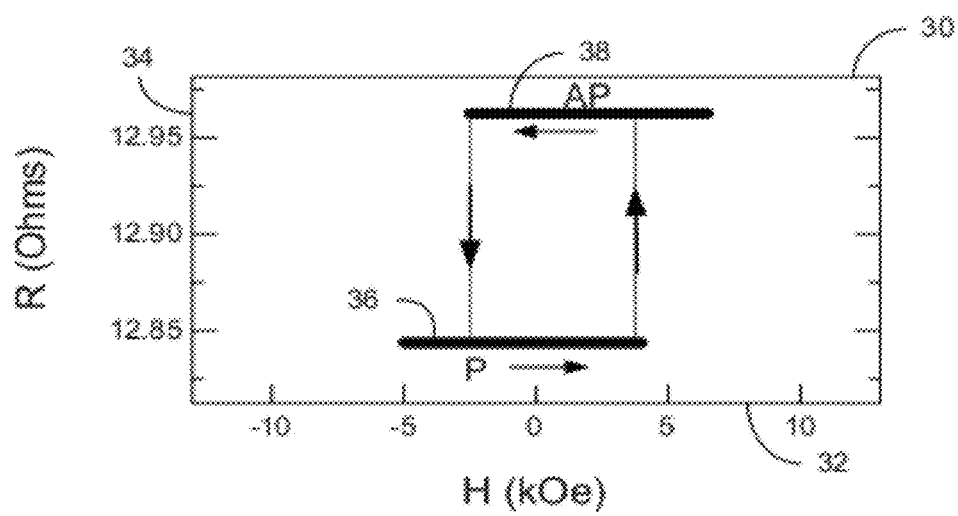
FIG. 1(b) shows a graph 30, of Resistance (R) 34, in Ohms, shown in the vertical direction (y-axis) of the memory element 16 vs. the magnetic field 32 (H), in kOe units, shown in the horizontal direction (x-axis), as applied to the memory element 16.

FIG. 1(b) shows a graph 30, of Resistance (R) 34, in Ohms, shown in the vertical direction (y-axis) of the memory element 16 vs. the magnetic field 32 (H), in kilo Oersted (Oe) units, shown in the horizontal direction (x-axis), as applied to the memory element 16. The graph 30 shows the relationship between the resistance of the pillar 16 of FIG. 1(a) and the relative directions of magnetization of the free layer 18 and the fixed layer 20. Stated differently, the direction of magnetization of the free layer 18 vs. the fixed layer 20 is parallel or anti-parallel depending on the history of the applied magnetic field. For example, at 36, the direction of the magnetization of the free layer 18 is parallel to the direction of magnetization of the fixed layer 20, whereas, at 38, the direction of the magnetization of the free layer 18 is anti-parallel to the direction of magnetization of the fixed layer 20. When increasing the field from large negative fields, the free layer reverses, whereas when decreasing the field from large positive fields, the free layer reverses.

Starting from 36, the direction of magnetization of the free layer 18 is in a parallel direction relative to that of the fixed layer 20 and then, the direction of magnetization of the free layer 16 switches to anti-parallel relative to that of the fixed layer 20 and then upon decreasing the applied field, the direction of magnetization of the free layer 18 switches back to parallel relative to that of the fixed layer 20. Thus, the graph 30 essentially shows field-induced reversal of the direction of magnetization of the free layer 16 resulting from the application of a magnetic field (H) and observed by measuring the change in resistance (R) of the device as the direction of magnetization of the free layer 18 switches from parallel to anti-parallel and visa versa relative to that of the fixed layer 20. When the direction of magnetization of the free layer 18 is anti-parallel, resistance (R) increases relative to when the direction of the free layer 18 is parallel to that of the fixed layer 20.

Stated differently, there are two stable magnetic states, those with the magnetization of the free layer 20 and the fixed layer 18 aligned parallel and anti-parallel. In one example, the parallel alignment represents a logical '1' state and the anti-parallel alignment represents a logical '0' state.

Figure 1C:
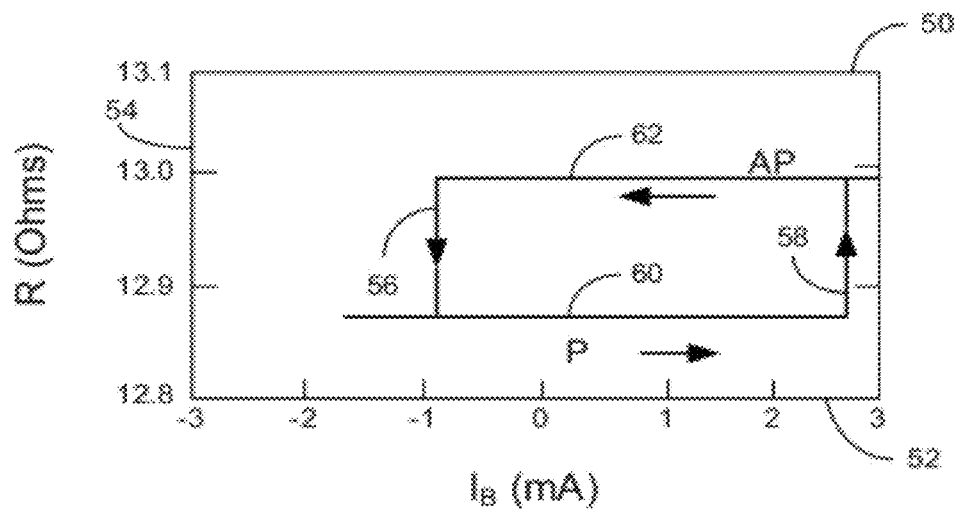
FIG. 1(c) shows a graph 50, of (R) 34, in Ohms, in the vertical direction (y-axis) vs. current 52 ($I_B$), in milli Ampere units, in the horizontal direction (x-axis), as applied to the memory element 16.

FIG. 1(c) shows a graph 50, of Resistance (R) 54, in Ohms, in the vertical direction (y-axis) vs. current 52 ($I_B$), in milli Ampere units, in the horizontal direction (x-axis), as applied to the memory element 16, of the memory element 16. The graph 50 represents current-induced reversal of the direction of magnetization of the free layer 18 when current ($I_B$) is applied to the memory element 16 and the change in magnetization is observed by measuring the change in resistance (R) of the device as the direction of magnetization of the free layer 18 switches from parallel to anti-parallel and visa versa relative to that of the fixed layer 20. In this connection, 60 and 62, in FIG. 1(c) show the resistances associated with the parallel and anti-parallel directions of magnetization of the free layer 18 relative to the fixed layer 20, whereas, 56 and 58, in FIG. 1(c) show the currents required to reverse the direction of magnetization of the free layer 18 relative to that of the fixed layer 20.

An understanding of the memory element 16 is vital because the rest of this document discloses embodiments and methods of fabrication and use of memory arrays built from the memory element 16 by, for example, stacking and/or placing side-by-side, in a horizontal plane, a plurality of the memory element 16 to build a large memory array (or high density memory elements).

Figure 2A:
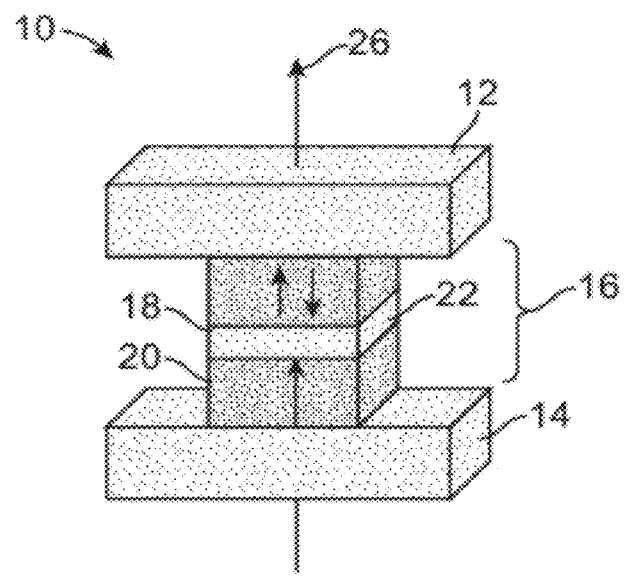
FIGS. 2(a)-(c) show alternative embodiments of the memory element 16 of FIG. 1(a) with different directions of magnetization in the free layer 18 and the fixed layer 20 in each embodiment.
Figure 2B:
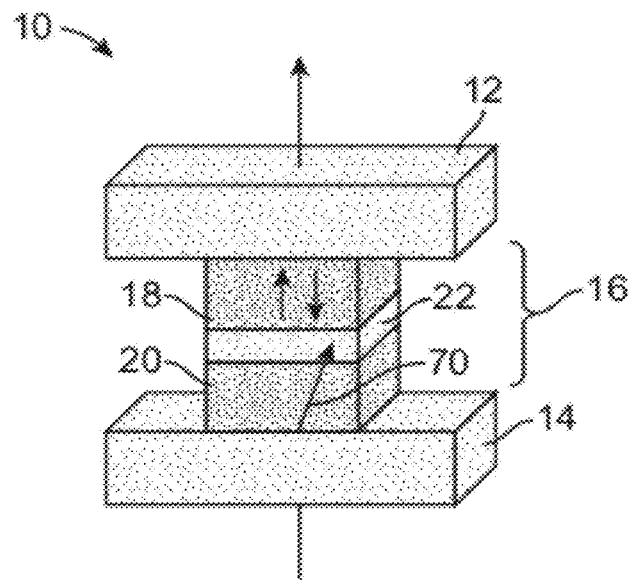
Figure 2C:
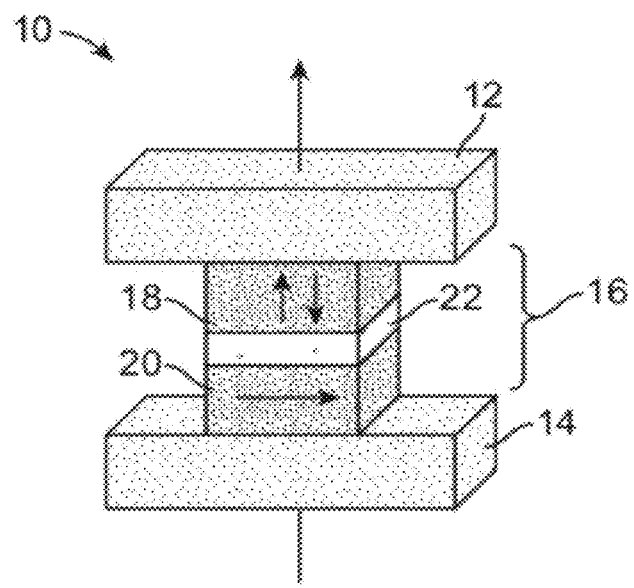

FIGS. 2(a)-(c) show alternative embodiments of the memory element 16 of FIG. 1(a) with different directions of magnetization in the free layer 18 and the fixed layer 20 in each embodiment. In FIG. 2(a), the free layer 18 and the fixed layer 20 have perpendicular anisotropy and the direction of magnetization is perpendicular to the plane, which is a preferred direction due to lower current requirements for switching relative to an in-plane anisotropy, such as shown in FIG. 1(a).

Depending on the direction of the bold arrows, i.e. the free layer 18 has magnetization pointing up (parallel to the y-axis) or pointing down (parallel to the y-axis), a logical or binary '1' or '0' is stored or written to the memory element 16. That is, the magnetization of the free layer 18 determines the state of stored bit. For example, in the case of an out-of-plane anisotropy device, if the direction of magnetization of the free layer 18 matches that of the fixed layer 20, this may indicate a binary state '1', whereas if the direction is opposite to that of the fixed layer 20, this may indicate a binary state '0' or vice versa.

In FIG. 2(c), while the direction of magnetization in the fixed layer 20 is parallel to the plane, the direction of magnetization in the free layer 18 is perpendicular to the plane. In FIG. 2(b), the direction of magnetization of the fixed layer is at a predetermined angle to normal.

Figure 3A:
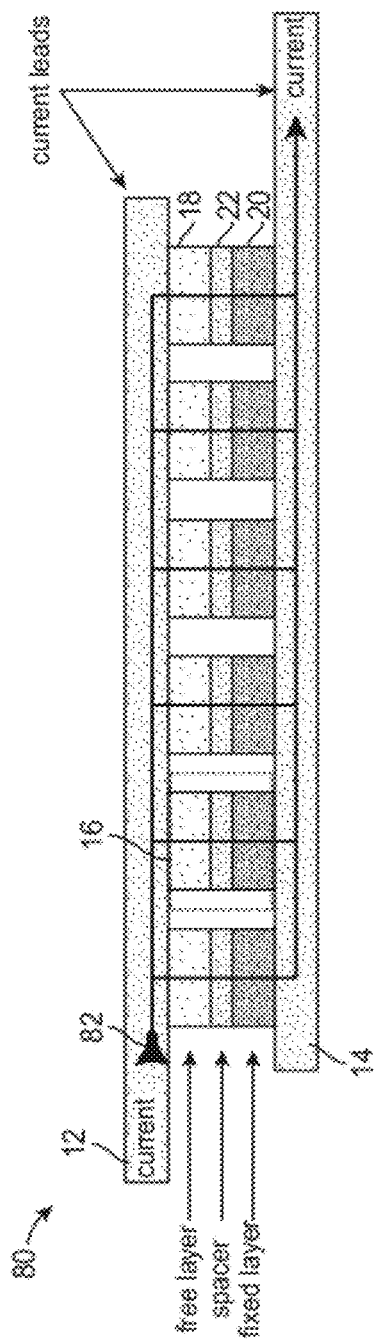
FIG. 3(a) shows a two dimensional (2-D) planar nonvolatile memory array 80 with a plurality of memory elements 16, shown in one horizontal plane and in accordance with an embodiment of the present invention.

FIG. 3(a) shows a two dimensional (2-D) planar nonvolatile memory array 80 with a plurality of memory elements 16, shown in one horizontal plane and in accordance with an embodiment of the present invention. The memory elements 16 are each shown to include a spacer 13. The 2-D array 80 of FIG. 3(a) allows for multiple memory elements comprising free and fixed layer couples to be added to a row with all memory elements connected to the leads 12 and 14. While there are five memory elements 16 shown in FIG. 3(a), any number of memory elements may be employed. In FIG. 3(a), the array 80 is a single-bit-per-cell configuration (a cell being the same as a memory element) where one cell can assume one of two states, i.e. '0' and '1'. The leads 12 and 14 provide a simple lead structure allowing for parallel read and write operations of and to all of the memory devices 16 to which the leads are connected. Current travels in a direction indicated by the arrow 82 or the reverse. Each free layer 18 of a memory element 16 has two unique resonant frequencies ($f_o$), associated with parallel and antiparallel fixed and free layers, designed by control of total magnetic anisotropy, i.e. using lithography to control shape anisotropy and/or by control of magnetocrystalline anisotropy using materials engineering. Accordingly, each memory element in the array can be written and read individually using frequency-space addressing.

As is apparent in FIG. 3(a) and additional embodiments of the present invention, herein, individual pairs of write and read lines to each element, used in conventional non-volatile memory are eliminated.

Figure 3B:
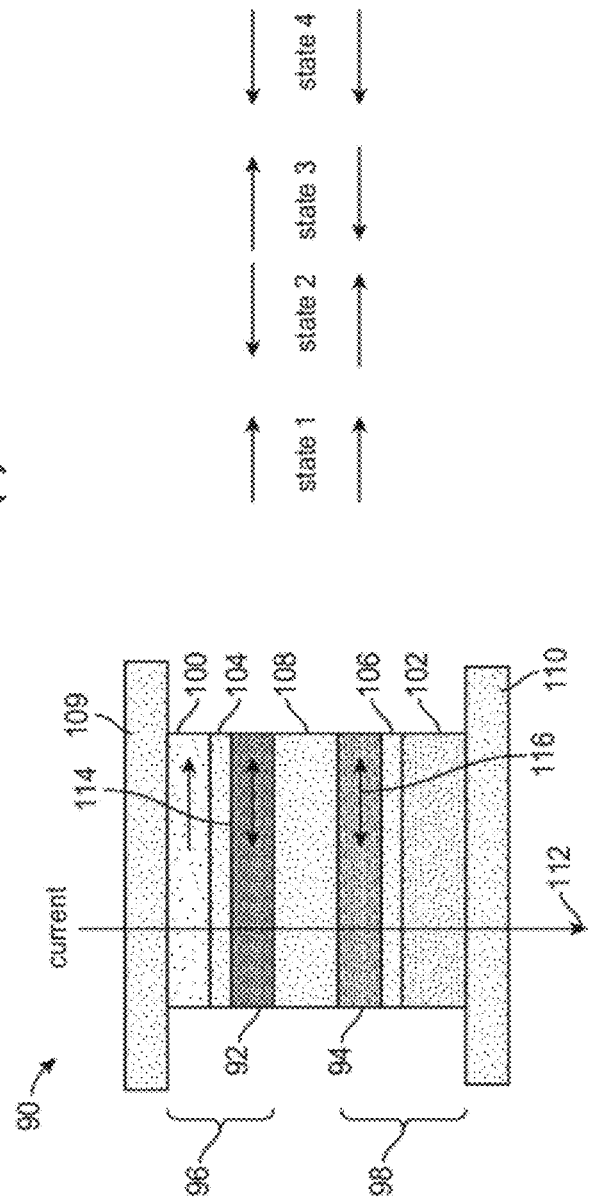
FIG. 3(b) shows a 2-D multi-bit-per-cell device (or nonvolatile memory array) 90 with two stacked free layers 92 and 94 of a plurality of memory elements 96 and 98, in accordance with another embodiment of the present invention.

FIG. 3(b) shows a multi-bit-per-cell device (or nonvolatile memory array) 90 with two stacked free layers 92 and 94 of a plurality of memory elements 96 and 98, in accordance with another embodiment of the present invention. The embodiment of FIG. 3(b) shows the in-plane anisotropy case with a plurality of memory elements, having more than one free layer, namely two, as shown in the figure, in the same stack. It should be noted that while the device 90 is shown to comprise two memory elements, other numbers of memory elements are contemplated.

More specifically regarding the device 90, there is shown a top lead 109 and a bottom lead 110 and therebetween are shown two memory elements 96 and 98, separated by a spacer 108. The memory element 96 is shown atop of the spacer 108 and further shown to include a free layer 92, which is directly formed on top of the spacer 108 and onto which a spacer 104 is formed. On top of the spacer 104 is formed a fixed (or pinned) layer 100. On top of the lead 110 is formed the memory element 98, which includes a fixed layer 102, a spacer 106 and a free layer 94. The fixed layer 102 is shown formed on top of the lead 110 and on top thereof is shown formed the spacer 106 and on top of the latter is shown formed the free layer 94. Because there are two free layers in the device 90 and each can take on a different direction of magnetization relative to the fixed layer of its corresponding memory element, four states or a two digit binary number can be stored in the device 90. The arrows 114 and 116 are shown as being dashed to indicate the two possibilities of the direction of magnetization for each of the free layers 92 and 94.

Stated differently, due to the stacking of the free layers, multiple bits, in particular two bits, are achieved. That is, two free layers will effectuate four binary states (00, 01, 10 and 11) because each free layer has two distinct easy magnetization directions, and these can be independently written and read in frequency space by virtue of each having a unique resonant frequency ($f_o$), designed either by control of shape anisotropy, using lithography as an example, and/or by control of magnetocrystalline anisotropy, such as using materials engineering. To provide a practical example, if the direction of the free layer 92 matched that shown, in FIG. 3(b), of the fixed layer 100, there would be a unique state represented, such as '0' and if the direction does not match, an opposite state might be represented, such as '1'. Coupling the foregoing with the unique states represented in a similar manner with reference to the memory element 98, there are altogether 4 states or two bits of information that may be stored within the device 90 due to the 2-memory element stacking thereof. The four states are noted on the right side of FIG. 3(b), as states 1-4 with each state showing the direction of magnetization of each of the two corresponding free layers 92 and 94. As earlier noted, there may be additional states or bits of information stored in the device 90 in the presence of additional stacked memory elements.

In an alternative embodiment, the layers of FIG. 3(b) may be formed in different order. For example, the fixed layer 102 may be formed on top the spacer 106, which may be formed on top of free layer 94 to form memory element 98. In a further alternative embodiment, the device 90 may include only one pinned (or fixed layer), such as the pinned layer 100 with the free layers 92 and 94 present, as described. In this case, the magnetic states of the free layers 92 and 94 are determined with reference to the magnetic state of the pinned layer 100. Moreover, additional free layers than those shown in FIG. 3(b) may be formed thus creating additional storage capacity. In this case, not every memory element will include a fixer layer.

Figure 4A:
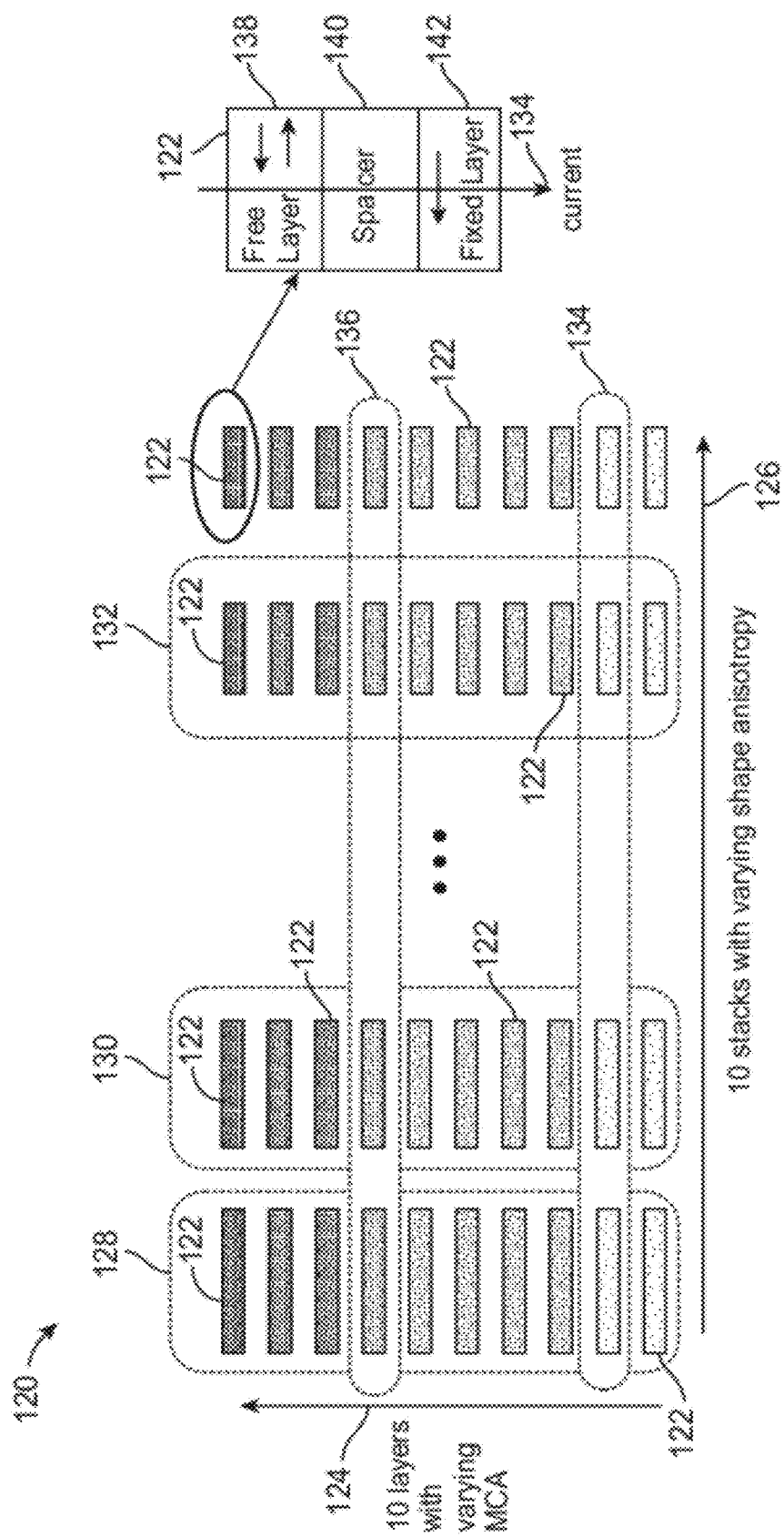
FIG. 4(a) shows a 3-D memory array 120 of nonvolatile memory elements 122 in accordance with yet another embodiment of the present invention.

FIG. 4(a) shows a 3-D nonvolatile memory array 120 made of nonvolatile memory elements 122 in accordance with yet another embodiment of the present invention. As will be appreciated, the 3-D structure is created by using varying magnetocrystalline anisotropy (MCA) in one dimension, and varying shape anisotropy in another dimension, with the net result of such varying anisotropies summing so that each memory element exhibits a different or unique total anisotropy and thus a different or unique resonant frequency ($f_o$) for each magnetic state. In the embodiment of FIG. 4(a), each plane of memory elements 122 has the same MCA, determined by the thin magnetic film structure for that layer. For example, in FIG. 4(a), 10 layers with varying MCA are shown in an upwardly direction by the arrow 124 (the lighter and darker shading of each of the memory elements of the different layers are shown to emphasize the varying MCA of the layers) and 10 stacks of memory elements 122 of differing shapes are shown horizontally by the arrow 126 (the different sizes of each of the memory elements of the different stacks are shown to further emphasize the shape anisotropy). Each stack of memory elements 122 has the same shape anisotropy designed by, for example, lithography. In the FIG. 4(a), there are 10×10 or 100 memory elements 122 depicted.

The array 120 includes 100 variations of shape and material of memory elements. That is, due to the presence of 10 layers and 10 stacks of memory elements, there are 100 memory elements, each distinguished by its shape and material and thus each having a unique resonant frequency for each magnetic state. To write a memory element from the array 120, in the presence of an alternating signal of unique frequency for that memory element, a lower current density is required than that of prior art for reversing the direction of magnetization.

The size of the array 120 depends on the number of shapes that can be manufactured, which is, at least in part, dependent on lithographic dimension limitations. Thus, as lithographic dimensions reduce, the number of memory elements in an array can increase because the elements can be formed closer together. Further, a large array of memory elements is fabricated with reasonable manufacturing costs and practical operations.

An exploded view of one of the memory elements 122 appears on the right-hand side of FIG. 4(a) wherein the memory element 122 is shown to include a fixed layer 142 on top of which is formed a spacer 140 on top of which is formed a free layer 138 with its magnetization direction parallel or anti-parallel to that of the fixed layer 142. The direction of current 144 is shown to be down.

To provide a practical example, while all of the memory elements of the stack 128 have the same shape anisotropy, all of the memory elements of the stack 128 have different shape anisotropy than the memory elements of the remaining nine stacks, including the stacks 130 and 132. Similarly, while all of the memory elements 122 of the layer 134 have the same MCA, the memory elements of the layer 134 have a different MCA than the memory elements of the remaining nine layers, including the layer 136. This results in each of the memory elements 122 of FIG. 4(a) having a unique resonant frequency for each magnetic state.

Thus, during a write operation, as will be shortly discussed, an alternating current (AC) corresponding to the resonant frequency of a desired state of a desired memory element, i.e. one to be written thereto, is applied. The alternating write current may be applied to the memory element or array of memory elements in conjunction with a direct current which may serve to lower the total energy required to switch the element to be written. That is, a direct current (DC) waveform may be applied to the memory element or array of memory elements either immediately before, during or immediately after the application of the alternating current which is frequency matched to the element which is to be written.

During a read operation, a DC current is applied which is large enough to excite all of the memory elements but not large enough to switch (magnetically reverse) any of them. Then, in response to the applied DC current, the memory elements each generate a radiofrequency (RF) waveform, which includes frequency information indicating whether the memory element is in a parallel or anti-parallel state.

An alternatively topography as previously discussed may be a different order of formation of layers, such as the free layer 138 on top of which is formed the spacer 140 on top of which is formed the fixed layer 142. In FIG. 4(a), yet another embodiment includes fewer fixed layers than there are free layers which would simplify processing without compromising functionality. The state of each memory element would be determined with respect to a nearby fixed layer.

Figure 4B:
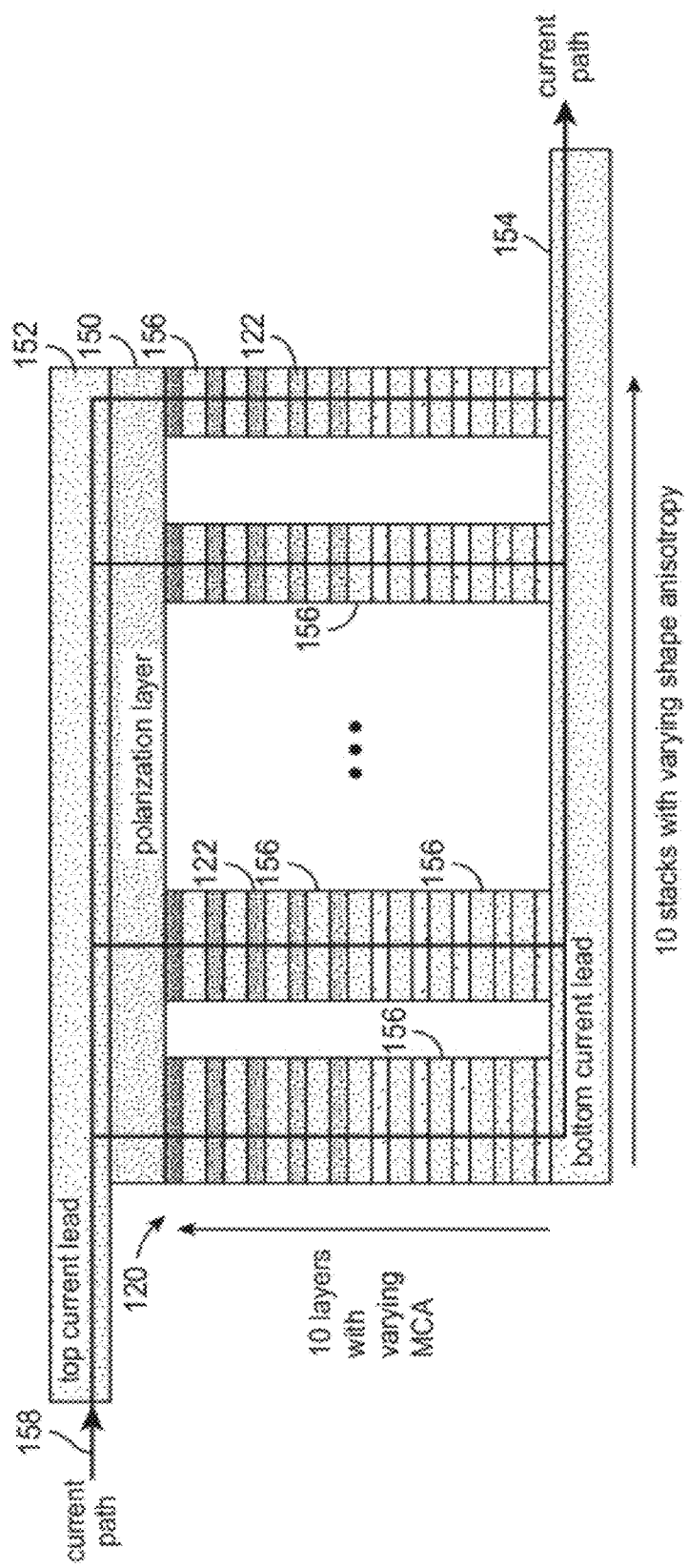
FIG. 4(b) shows the array 120 of FIG. 4(a) further developed to have a polarization layer 150 formed on top of the stacks of memory elements, on top of which is formed a top current lead 152 and a bottom current lead 154 is formed below the stacks of memory elements.

In another embodiment, a single fixed layer in a stack of multiple free layers is described. FIG. 4(b) shows the array 120 of FIG. 4(a) further developed to have a fixed layer 150 formed on top of the stacks of memory elements, on top of which is formed a top current lead 152 and below which is formed a bottom current lead 154 is formed. Each of the memory elements 122 is separated from the other by a conducting spacer 156. The current is applied to the lead 152 and follows a path shown by the arrow and lines of 158. As previously noted, the order of formation of layers may be different and as an example, a free layer 150 may be below the stacks of memory elements.

In one embodiment, the fixed layer 150 (also known as a hard layer or a polarizing layer) is made of permanently magnetized magnetic material, well known to those of ordinary skill in the art, such as the antiparallel composite material 25 Å $Co_{50}Fe_{50}$/8 Å Ru/25 Å $Co_{50}Fe_{50}$. It is permanently magnetized such that it always polarizes the electrons coming through the device in one direction.

While it may be possible to operate the array 120 with a single fixed layer 150, as shown in FIG. 4(b), it may be necessary to have more than one fixed layer within each stack of memory elements, or to have one fixed layer for every memory element. The stacks are separated from each other by an electrically insulating material, such as $Al_2O_3$, and the memory elements in each stack are separated from each other by a conductive spacer layer, for example made of Cu or Ru.

Care must be taken in choosing materials for the manufacturing of the memory elements of the memory array, and in lithographic patterning of those same elements, to ensure that the resonant frequencies of each of the memory elements are far enough apart so as to eliminate undesirable excitation or selection of incorrect memory elements.

Figure 5A:
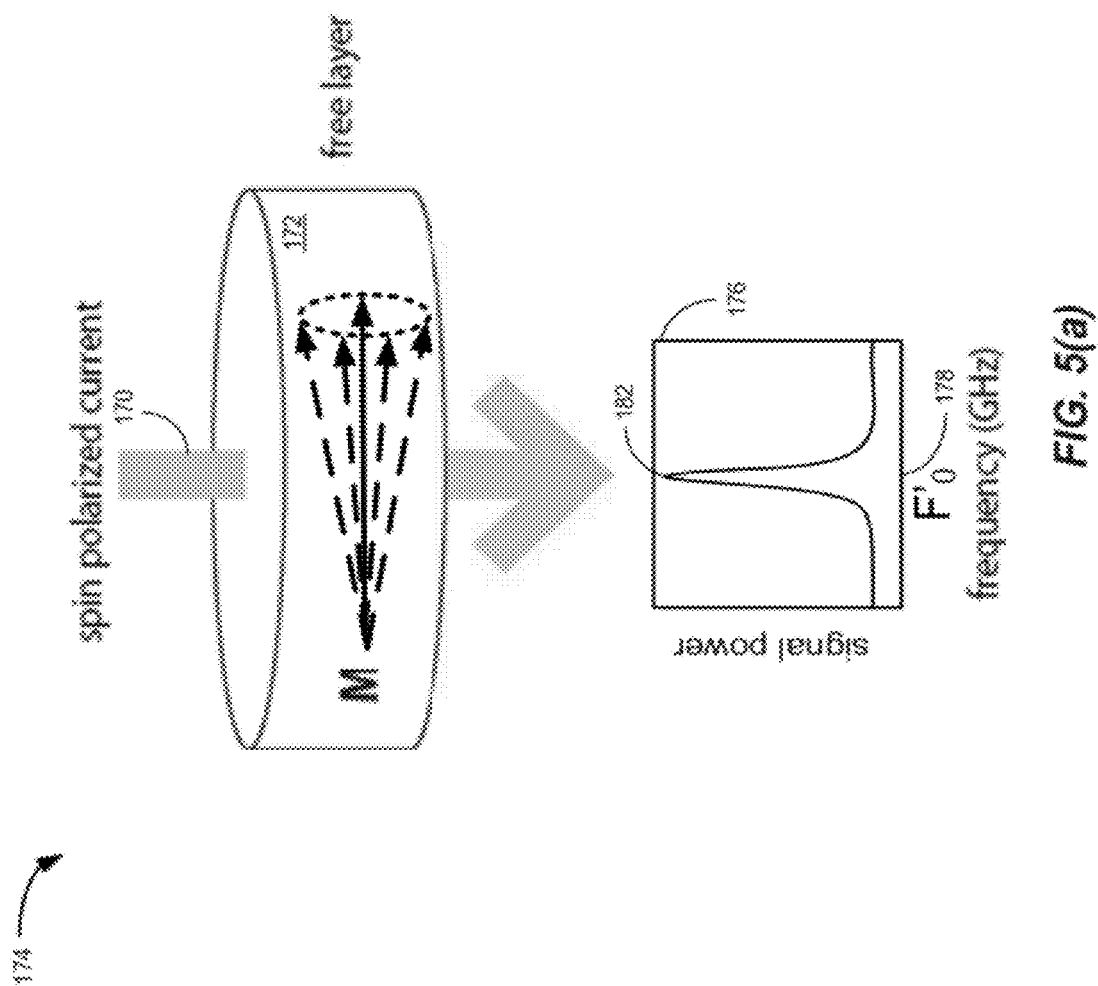
FIG. 5(a) shows the result of a torque being exerted on the magnetization (M) of the free layer of a memory element, such as the memory element 16 of FIG. 1(a).

FIG. 5(a) shows the result of a spin transfer torque being exerted on the magnetization (M) of the free layer of a memory element, such as the memory element 16 of the foregoing figures. In FIG. 5(a), at 174, a spin polarized current of magnitude suitable for a read operation of the free layer 172 of a memory element is applied at 170, which causes a torque to be exerted on the magnetization M of the free layer 172 causing it to precess around the easy axis of magnetization, i.e. the lowest energy state. That is, a signal is produced, as a result of the magnetization (M), represented by the arrow 180 and the dashed arrows therearound, precessing a resonant frequency ($f_0$) related to the total anisotropy of the free layer 172.

As shown in the graph 176, if the signal power of the free layer 172 is measured at the resonant frequency ($f_0$) 178, a peak 182 is detected. The direction of magnetization of the free layer 172 is shown by the arrow 180 and the magnetization M precesses about the axis of the arrow 180. The areal current density related to the current used for spin precession must be low enough so as avoid reversing the free layer magnetization and also avoid melting the free layer 174 through Ohmic heating. In an exemplary embodiment, the upper limit of this current density is $10^9$ A/cm$^2$.

Figure 5B:
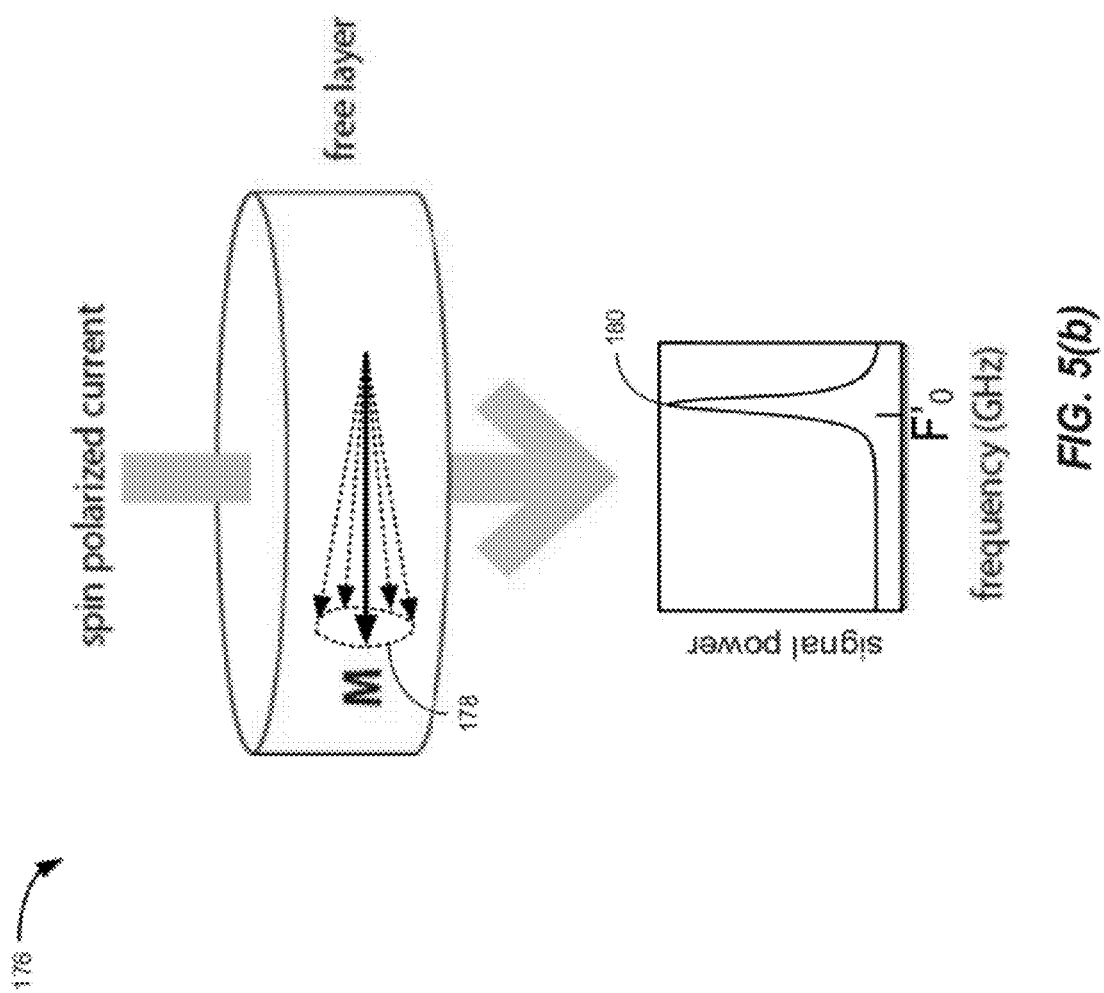
FIG. 5(b) shows a memory element 176, similar to that of FIG. 5(a), except that the direction of magnetization is 178 is opposite to that of FIG. 5(a).

FIG. 5(b) shows a memory element 176, similar to that of FIG. 5(a), except that the direction of magnetization is 178 is opposite to that of FIG. 5(a), as measured relative to the direction of the magnetization of a nearby fixed layer. For this reason, the peak 180 of the signal power is at a different resonant frequency ($f'_0$).

Figure 6A:
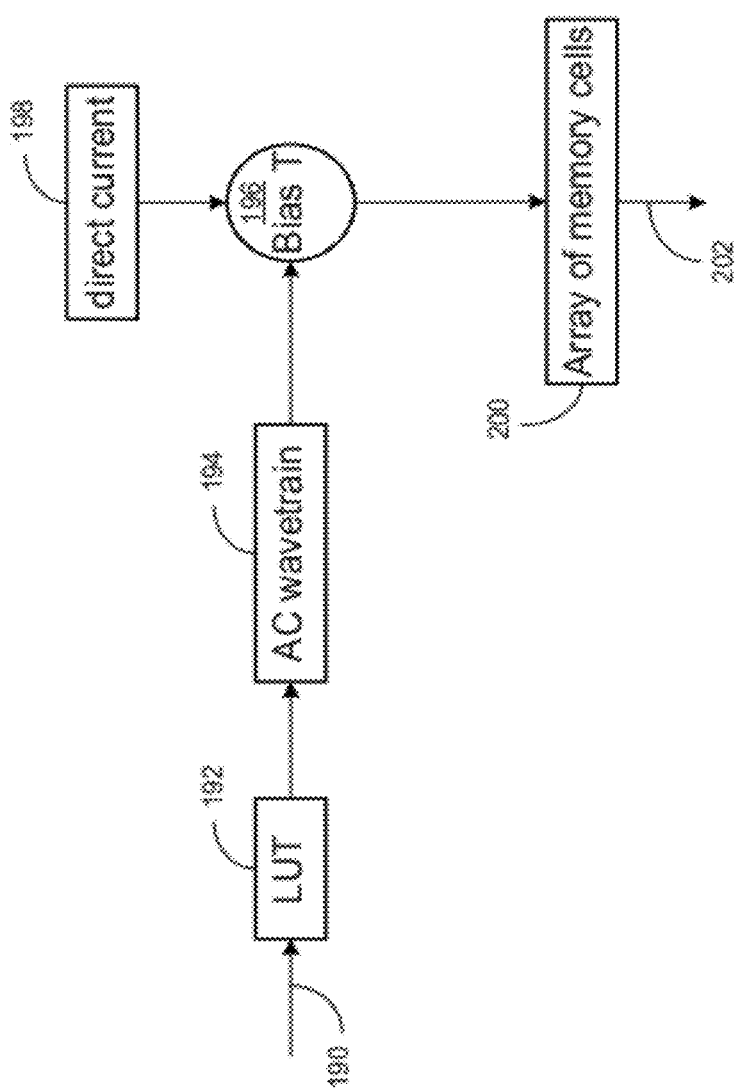
FIGS. 6(a) and 6(b) show block diagrams of the steps performed in writing to and reading from, respectively, a memory element, such as the memory element 16 of FIG. 1(a), in accordance with methods of the present invention.
Figure 6B:
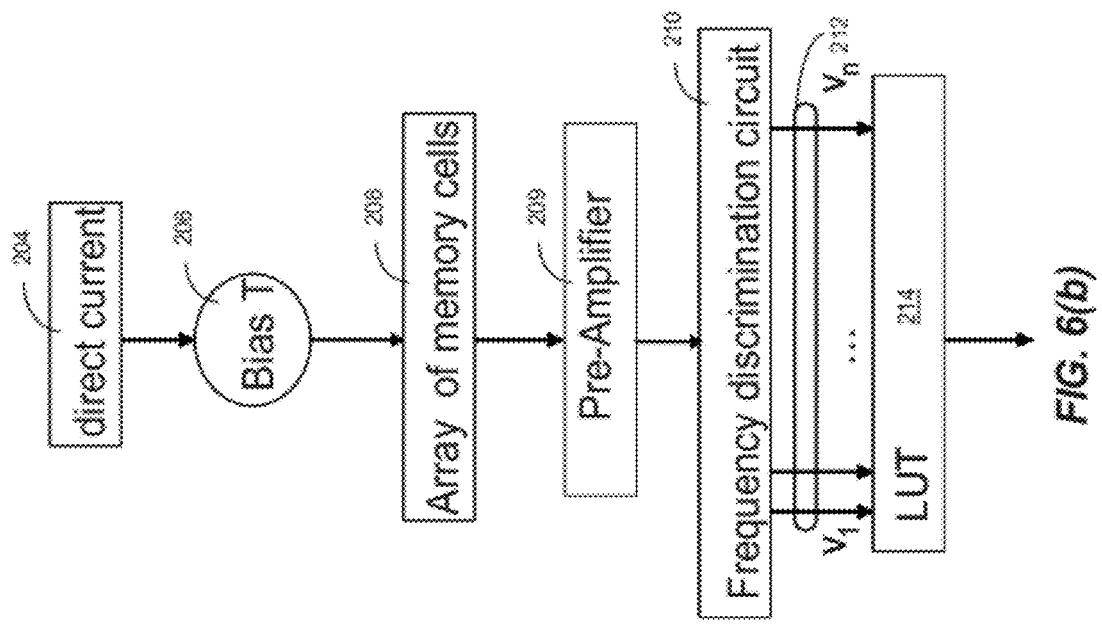

FIGS. 6(a) and 6(b) show block diagrams of the steps performed in writing to and reading from, respectively, a nonvolatile memory element, such as the memory element 16 of the foregoing figures, in accordance with methods of the present invention. With reference to FIG. 6(a), a location signal 190 representing the location to which a value is to be written in memory is provided to a look-up-table (LUT) block 192. The output of block 192 is a frequency corresponding to or matching the resonant frequency of the memory element to which data will be written. Thus, the block 192 is a table of stored information correlating locations to frequencies and vice versa. The output of the block 192 is provided to the AC wavetrain block 194, which essentially provides an AC signal having the desired resonant frequency or the frequency provided by the block 192.

The alternating current (AC) signal (or current), from the block 194, is added to a DC signal from the DC current block 198, by the Bias T unit 196, which provides an input to the array of memory cells 200 and the AC excites the memory element which is intended to be written thereto. It is the AC signal that determines which memory element is selected or addressed for writing thereto because it carries the frequency resonant to the memory element to be written thereto. When the AC is provided to an entire stack of memory elements through the top or bottom leads, the need for many wires is eliminated by virtue of frequency addressing, described herein, which simplifies device architecture over that of prior art.

The direct current (DC) (or DC signal) of the block 198 may be used to program the desired memory element. The foregoing DC signal may be applied through the top lead and bottom lead of an array of memory elements. This applies as well to the application of DC during a read operation. Alternatively, a combination of DC and AC is used with the AC being one or more AC pulses added into a DC pulse to form a wave train. Still alternatively, AC pulses with no DC may be employed for read and write operations.

An array made of memory elements of the present invention may be written to in parallel or serially. When writing to an array of memory elements, in parallel, a current wave train is applied to the memory elements comprising a DC component and a selection of AC components, the frequencies of which are matched to the microwave oscillation frequencies of the specific memory states of the specific memory elements which are to be written.

Addressing or selecting a memory element based on the resonant frequency associated therewith and that is unique to each memory element is referred to as frequency addressing.

When writing serially, a DC component and an AC component are applied which match the microwave oscillation frequency of a single memory element which is being written thereto.

In FIG. 6(b), when reading, a DC current is applied to the entire array of memory elements (to the array of memory cells 208), at the step 204. An amplification or pre-amplification is performed at step 209 on the signal from the array of memory cells 208 and prior to the frequency discrimination circuit 210, which operates thereon. The applied DC excites all of the memory elements so that the frequency discrimination circuit at step 210 can then determine which free layers are in which magnetization state and this information is represented by various voltage levels, on the signal 212, corresponding to various resonant frequencies, which is provided to the LUT block 214 and the output of the LUT block 214 generates memory state information.

Location information includes the address of the memory location where information is desired to be read therefrom. $V_n$ is high/low depending on the whether the corresponding $f_n$ is present in the wave train. The LUT of the block 214 correlates $V_n$ to a anti-parallel/parallel configuration of a specific memory element or cell. The blocks 192 and 214 are essentially the same blocks wherein during a write operation, the LUT is provided with location information and provides corresponding frequency information and during a read operation, the LUT is provided with frequency information and provides corresponding location information. The level of the DC is generally lower, during the read operation, relative to the DC of the write operation.

FIG. 7(a) shows the timing diagram of some of the signals generated and used during the write operation of FIG. 6(a). For example, the DC signal 220 is the output of the block 198 of FIG. 6(a), the AC wave train signal 222 is the output of the 194 of FIG. 6(a) and the Bias T output signal 224 is the output of the Bias T 196 of FIG. 6(a). FIG. 7(b) shows the timing diagram of some of the signals generated and used during the read operation of FIG. 6(b). For example, the DC signal 226 is the output of the block 204 of FIG. 6(b), the output wave train signal 228 is the output of the block 208 of FIG. 6(b) and the voltage signal 230 is the output of the circuit 210 of FIG. 6(b), which corresponds to resonant frequencies, as earlier noted.

Figure 8:
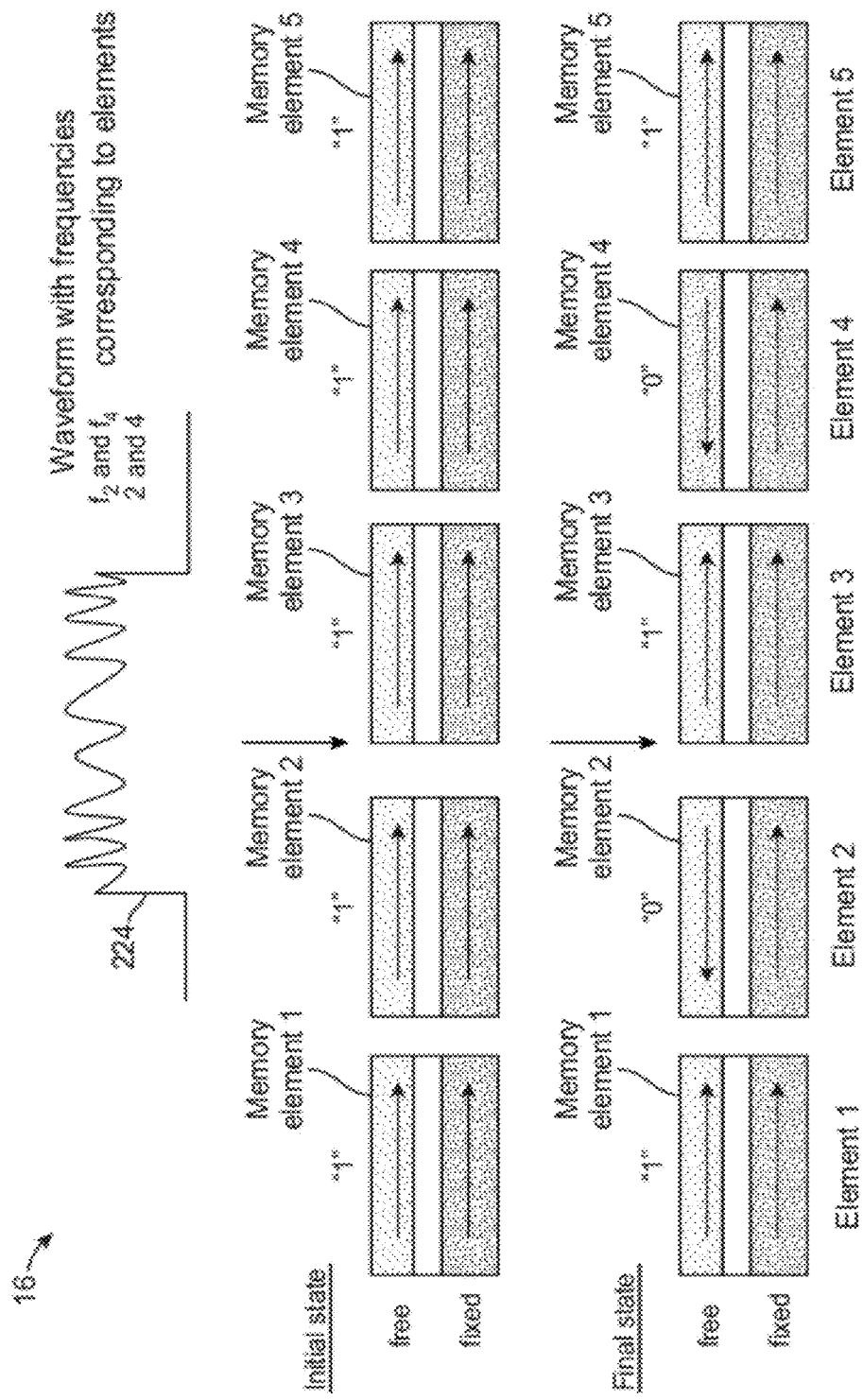
FIG. 8 shows the initial states and resulting or final states of the free layers and fixed layers of five memory elements, such as the memory element 16, of FIG. 1(a) in accordance with an embodiment of the present invention.

FIG. 8 shows the initial states and resulting or final states of the free layers and fixed layers of five memory elements, such as the memory element 16, of FIG. 1(a) of the foregoing figures. The initial states of all of the five memory states, prior to programming or writing thereto are in logical state '1' with magnetization states of directions thereof of the free layers and fixed layers all pointing in the same direction (they are parallel). During the write operation, when the signal 224 (of FIG. 7(a)), having the waveform shown in FIG. 8 and including frequencies $f_2$ and $f_4$ corresponding to memory elements 2 and 4, is applied, the states of memory elements 2 and 4 are changed to logical state '0' where the free layer magnetization is reversed to a direction opposite to that of the fixed layer of the same memory element (they are anti-parallel). This is due to the waveform 224 having frequencies matching the resonant frequencies of the memory elements being written thereto.

Prior to writing data to the device, the LUT would need to be initialized with the resonant frequencies of all the memory elements. This could be done, for example, by placing the device in a large magnetic field so as to set the direction of all the layers to be parallel to the field. The field could then be set to zero. A DC would be applied so as to measure the resonant frequencies of all devices in the parallel state. The field would then be slowly increased in the reverse direction while monitoring the ac waveform output. As the field increases, the first free layer will reverse, and one of the frequencies in the wave form will vanish and a new frequency will appear. This then identifies the two frequencies of device at location 1, and those are stored in the LUT. The field is the increased further, and each free layer will then reverse in succession, identifying the frequencies of each free layer, and thus populating the entire LUT.

Figure 9:
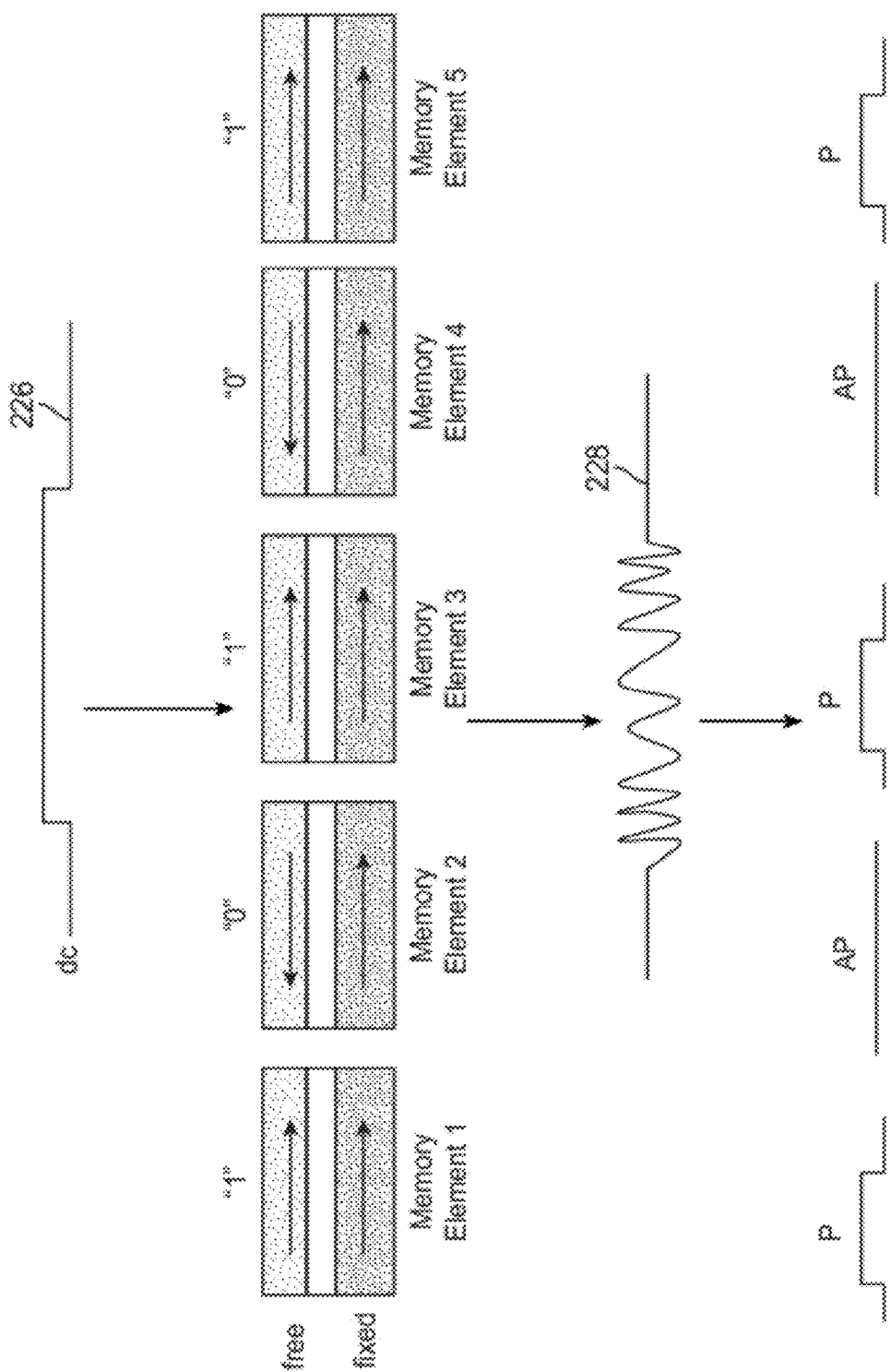
FIG. 9 shows the steps discussed relative to a read operation and to FIG. 7(b) pictorially with the free and fixed layers of memory elements 1-5 shown during a read operation, in accordance with an embodiment of the present invention.

FIG. 9 shows the steps discussed relative to a read operation and to FIG. 7(b) pictorially with the free and fixed layers of memory elements 1-5 shown during a read operation, in accordance with an embodiment of the present invention. In FIG. 9, the signal 226 (of FIG. 7(b)) is applied to all of the memory elements 1-5 thereby exciting all of them. An AC waveform or signal, such as the signal 228, is generated from the memory elements, corresponding to the directions of magnetization thereof. That is, the waveform (or wave train) of the signal 228 includes the frequencies $f_n$ which are the resonant frequencies of the memory element states. This information is used to generate the voltages, Vn, used by the LUT block 214, of FIG. 6(b), to correlate with an AP/P configuration of a specific cell or memory element. Thus, in FIG. 9, the state '1' of the memory element 1 is read as being in the P, or parallel, configuration, whereas, the state '0' of memory element 2 is read as being in the AP, or anti-parallel, configuration of the memory element 2 and so on.

Figure 10:
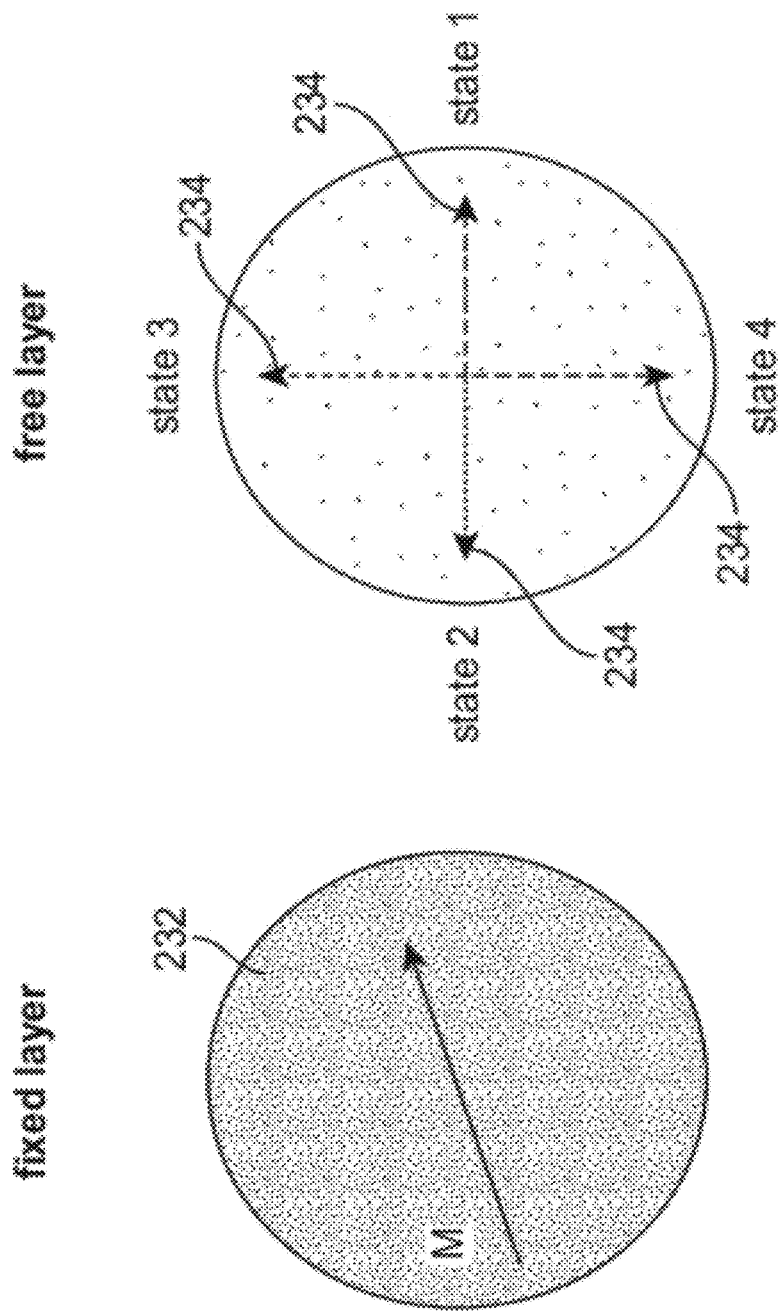
FIG. 10 shows exemplary states of the top of the free layer of a memory elements of the present invention relative to the state of the fixed layer, wherein the free layer can store four states or two bits, of digital information.

FIG. 10 shows a top view of the exemplary states of a free layer of a memory elements of the present invention, relative to the state of the fixed layer, and can be used in any of the foregoing embodiments. In this embodiment, there are specifically four possible low energy magnetization states for the free layer that are each logical states, representing a 2-digit binary value, arising from magnetization of the free layer having equiaxial magnetocrystalline anisotropy (i.e., having two energetically equivalent easy axes of magnetization, or four-fold magnetic symmetry). The magnetization of the fixed layer, shown at 232, by M, needs to be at a finite or predetermined angle relative to the easy axes of the free layer to break the inherent symmetry. Accordingly, each of the four states of magnetization of the free layer, shown at 234, has a unique resonant frequency, $f_0$.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A two-dimensional (2-D) planar nonvolatile memory array comprising:
   a plurality of memory elements wherein each memory element stores at least one bit of data and formed between a top lead and a bottom lead, through which current is applied and travels, each memory element including,
   a magnetic fixed layer formed between the top and bottom leads;

a magnetic free layer formed between the top and bottom leads, wherein the free layer is substantially made of material and thickness thereof consisting of the group: 22 .ANG. of Co.sub.50Fe.sub.50 and the bilayer structure 6 .ANG. Co.sub.50Fe.sub.50/35 .ANG. Ni.sub.80Fe.sub.20; and a non-magnetic spacer formed between the fixed and free layers.

2. A two-dimensional (2-D) planar memory array, as recited in claim 1, wherein the fixed layer is substantially made of material and thickness is 25 Å $Co_{50}Fe_{50}$/8 Å Ru/25 Å $Co_{50}Fe_{50}$.

3. A two-dimensional (2-D) planar memory array, as recited in claim 1, wherein the spacer is substantially made of and has a thickness of 40 Å Cu.

4. A two-dimensional (2-D) planar memory array, as recited in claim 1, wherein the free and fixed layers each have in-plane anisotropy.

5. A two-dimensional (2-D) planar memory array, as recited in claim 1, wherein the free and fixed layers each have perpendicular anisotropy.

6. A two-dimensional (2-D) planar memory array, as recited in claim 1, wherein the fixed layer has an anisotropy at an angle at a predetermined angle the respect to that of the free layer.

7. A two-dimensional (2-D) planar memory array, as recited in claim 1, wherein the memory elements of the plurality of memory elements are spin transfer torque (STT) memory elements.

8. A two-dimensional (2-D) planar memory array, as recited in claim 1, wherein the memory array is made by a lithographic process.

* * * * *